(12) United States Patent
Schmollngruber et al.

(10) Patent No.: US 8,076,739 B2
(45) Date of Patent: Dec. 13, 2011

(54) MICROMECHANICAL COMPONENT AND METHOD FOR PRODUCING A MICROMECHANICAL COMPONENT

(75) Inventors: Peter Schmollngruber, Aidlingen (DE); Hans Artmann, Boeblingen-Dagersheim (DE); Thomas Wagner, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/451,315

(22) PCT Filed: May 26, 2008

(86) PCT No.: PCT/EP2008/056398
§ 371 (c)(1),
(2), (4) Date: Mar. 29, 2010

(87) PCT Pub. No.: WO2008/148654
PCT Pub. Date: Dec. 11, 2008

(65) Prior Publication Data
US 2010/0176469 A1    Jul. 15, 2010

(30) Foreign Application Priority Data
Jun. 6, 2007    (DE) .................. 10 2007 026 445

(51) Int. Cl.
*H01L 29/84*    (2006.01)

(52) U.S. Cl. ......... 257/419; 257/E29.324; 257/E21.214; 257/E23.145; 438/53

(58) Field of Classification Search .................. 257/415, 257/419, E29.324, E21.214, E23.145; 438/53
See application file for complete search history.

(56) References Cited

U.S. PATENT DOCUMENTS

| | | | |
|---|---|---|---|
| 5,511,428 A * | 4/1996 | Goldberg et al. ............... 73/777 |
| 6,468,889 B1 * | 10/2002 | Iacoponi et al. ............. 438/597 |
| 2004/0104454 A1 * | 6/2004 | Takaoka et al. ............... 257/621 |
| 2005/0133880 A1 * | 6/2005 | Benzel et al. .................. 257/499 |
| 2006/0205211 A1 * | 9/2006 | Kirby ............................ 438/667 |

FOREIGN PATENT DOCUMENTS

| | | |
|---|---|---|
| DE | 100 32 579 | 1/2002 |
| DE | 103 23 559 | 12/2004 |
| DE | 103 59 217 | 7/2005 |
| DE | 10 2005 053 861 | 5/2007 |

* cited by examiner

*Primary Examiner* — Benjamin Sandvik
*Assistant Examiner* — Wensing Kuo
(74) *Attorney, Agent, or Firm* — Kenyon & Kenyon LLP

(57) ABSTRACT

A micromechanical component includes a substrate that has a front side and a backside, the front side having a functional pattern, which functional pattern is electrically contacted to the backside in a contact region. The substrate has at least one contact hole in the contact region, which extends into the substrate, starting from the backside.

7 Claims, 8 Drawing Sheets

MICROMECHANICAL COMPONENT AND METHOD FOR PRODUCING A MICROMECHANICAL COMPONENT

BACKGROUND OF THE INVENTION

1. Field of the Invention

The present invention relates to a micromechanical component, e.g., a pressure sensor.

2. Description of Related Art

A micromechanical device, in particular a pressure sensor, is known from published German patent document DE 103 23 559 A1, the pressure sensor being based on a piezoresistive converter principle for converting a mechanical force into an electrical signal. One usual construction of a micromechanical pressure sensor having piezoresistive converter elements is shown in FIG. 1. A substrate having an anodically etched diaphragm is bonded anodically onto glass. It is also known according to published German patent document DE 100 32 579 A1 that one may produce the diaphragm, and a cavity lying behind it, using porous silicon. Such a sensor construction is represented in FIG. 2. The chip is adhered onto a ceramic or into a premold housing, and is passivated using gel, that is held on the chip by a gel ring, for protection against environmental influences. Passivating using gel has the disadvantage that gas diffuses into the gel, especially if it is under high pressure. When the dissolved gas becomes gaseous again, for instance in response to a pressure drop, the bonding wires running in the gel, which make contact with the chip, may be destroyed. An electrical plated-through hole to the backside of the substrate is also known, from published German patent document DE 103 59 217 A1, such a design being comparatively thin in the area of the contact holes, and thus not very stable.

BRIEF SUMMARY OF THE INVENTION

By contrast, the micromechanical component according to the present invention has the advantage that the substrate in the contact region acquires a higher stability or load carrying capacity. Such a backside contacting also reduces stress coupling on the front side of the micromechanical component, for instance, in case of a flip-chip mounting. The diaphragm, within the meaning of the present invention, is made up of the substrate material, that is usually silicon. The term "mechanically stable diaphragm", within the meaning of the present invention, denotes a diaphragm which makes a contribution to the load carrying capacity of the substrate. Thus, the diaphragm is able to have a low strength compared to the substrate. Within the meaning of stability, a diaphragm is advantageous which has a strength that amounts to one-half of the strength of the substrate, for example. Within the meaning of the present invention, the term contact region designates the entire region between the front side and the backside of the substrate in which the contact holes are provided. A higher stability in the contact region advantageously permits larger contact holes, that is, contact holes having a larger cross section. This creates the advantageous possibility of etching the contact holes using a higher etching rate, which simplifies and speeds up the production process for the micromechanical component according to the present invention. The functional pattern has, for instance, etched and/or doped areas which make possible the actual chip function of the micromechanical component according to the present invention, such as a sensor patterning. The design of the micromechanical component according to the present invention is simple and cost-effective to produce, and is particularly suitable for micromechanical sensors, especially pressure sensors. Particularly advantageously the micromechanical component according to the present invention is able to be used as a pressure sensor in high pressure ranges, for instance, at 10 bar and higher. Because of the design according to the present invention, the micromechanical component is also particularly suitable for absolute or for differential pressure measurement in chemically aggressive environments, such as in the field of particle filters. Additional fields of application, in which, for instance, the use of a component having a passivating gel is not possible, or is at least difficult, may be covered by the micromechanical component according to the present invention, for example, as sensor for the tire pressures of vehicle, or as a pressure sensor for air bags, especially side air bags.

The contacting takes place through the wafer, that is, all the way through the substrate, according to the present invention. For this purpose, the substrate has at least one contact hole, four contact holes, for example, which extend from the backside of the substrate all the way into it. It is preferred that the electrical contacting between the functional pattern and the backside be formed of an electrically conductive material, particularly of metallic conductors and/or of doped semiconductor material, particularly preferred of polycrystalline silicon. Furthermore, it is preferred if at least a part of the backside and/or the contact hole is coated with an electrically conductive material, so that the backside of the substrate is partially provided with an electrically conductive layer, particularly around the contact holes, which extends all the way into the contact holes, so that an electrically conductive connection from the backside all the way into the contact holes exists. The electrical contacting between the functional pattern and the contact holes is also implemented by the electrically conductive material, that is, for example, by metallic conductors and/or by doped silicon. On the backside there is preferably formed an electrical contact or contact region which is able to be connected, either directly, for instance via a flip-chip contacting or via a bonding wire in an electrically conductive manner, to a printed-circuit board.

According to one specific example embodiment it is provided that the front side of the substrate has an epitaxial layer, the contact hole extending up to the epitaxial layer or into the epitaxial layer. An oxide layer is particularly preferably situated between the substrate and the epitaxial layer, at least in the contact region, which advantageously may be used as a stop oxide layer for a trench etching process, which greatly improves the tolerance in the production of the contact holes.

According to one additional specific example embodiment, it is provided that the substrate have one or more plated-through holes in the contact region, the plated-through holes connecting the contact hole with the front side. The cross sectional surface of the plated-through holes, within the meaning of the specific embodiment, is clearly smaller than the cross sectional surface of the contact hole, so that advantageously no considerable restrictions of the mechanical stability of the diaphragm take place because of the plated-through holes. The plated-through holes are especially preferably coated or filled with an electrically conductive material.

One further subject matter of the present invention is a method for producing a micromechanical component, at least one contact hole being applied into the substrate from the direction of the backside in such a way that the mechanically stable diaphragm remains between the contact hole and the front side, the electrical contact between the functional pattern and the backside being produced all the way through the diaphragm. Using the method according to the present invention, advantageously substrates having high stability in the contact region may be produced, which, for instance, permits larger contact holes, and thus the etching having a higher etching rate. The production according to the present invention is therefore advantageously particularly simple and rapid.

According to one specific example embodiment it is provided that the contact hole be produced by trench etching, the etching process being stopped in a controlled manner preferably at an epitaxial layer or in the epitaxial layer, provided one is present. In one particularly preferred specific embodiment, before the application of the epitaxial layer, at least in the contact region an oxide layer is applied onto the substrate, and the etching process is stopped at the oxide layer. The oxide layer produced preferably by thermal oxidation preferably stops the etching process, and thus permits higher tolerances.

According to another specific example embodiment it is provided that one or more plated-through holes be produced by a second etching process, so that the plated-through holes connect the contact hole to the front side. The plated-through holes may be produced before the etching of the contact holes, in principle, they being denoted, in this case, as blind holes as long as the contact hole has not yet been etched. In the case of prior etching of the contact holes, the production of the plated-through holes takes place either starting from the direction of the contact hole or from the front side. Before the etching of the plated-through holes, an etching mask is preferably applied, for instance, using a spray lacquer. If the plated-through holes are etched starting from the contact hole, the etching process is preferably stopped at a surface metallization on the front side. A possible backside insulation of the surface metallization is opened for contacting, especially preferably using a dry etching step. The previous application of the spray lacquer is able to take place without a mask, on account of the high aspect ratio of the narrow plated-through hole.

According to still another specific example embodiment, it is provided that the plated-through holes be etched straight-through, that an insulating layer is deposited, and thereafter an electrically conductive material is applied, preferably in one step on the front side and in the plated-through hole, as well as in the contact hole, preferably, and on the backside.

Before the application of an electrically conductive material, it is known to one skilled in the art, that first an insulating layer is applied, as a rule, by deposition. Within the meaning of the present invention, the application of an electrically conductive material, to the extent that it is required, is therefore to be understood always in connection with the preceding depositing of an insulating layer, even when the latter is not necessarily mentioned as a process step, in the following.

According to yet another specific example embodiment, it is provided that, before the etching of the contact hole, blind holes are produced starting from the front side, are insulated and preferably filled using an electrically conductive material, the blind holes being opened by the etching of the contact hole starting from the backside, and thus forming the plated-through holes.

Methods for depositing or filling up using electrically conductive materials are, for example, sputtering, low-pressure chemical vapor deposition (LPCVD), galvanics (with or without current) or vapor depositing.

For the insulation of the contact region, an oxidized insulation trench is preferably provided which is especially preferably produced at the same time as the plated-through holes or blind holes in one process step, by trench etching. Alternatively, the insulation of the contact region may be produced by doped regions.

DETAILED DESCRIPTION OF THE INVENTION

Figure 1:
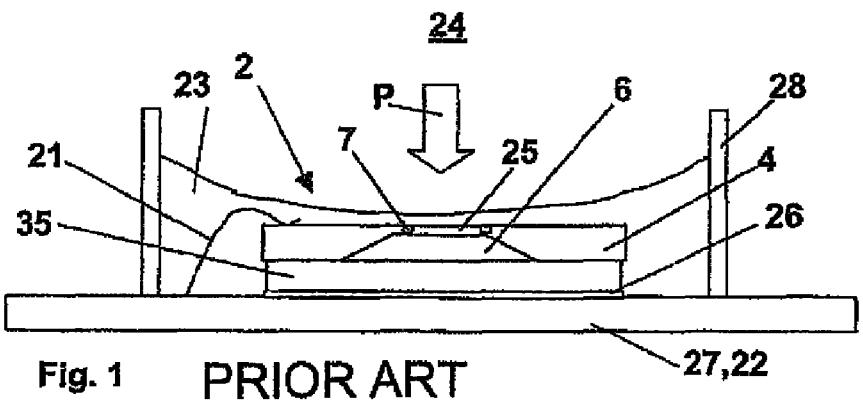
FIGS. 1 to 3 show pressure sensors having a sensor design according to the related art.

FIG. 1 shows the design of a micromechanical silicon pressure sensor having a functional pattern 7, in this case using piezoresistive converter elements. A substrate 4 has a front side 2, which faces a pressure medium 24. The pressure of the medium 24 acts on the pressure sensor in the direction of arrow P. On front side 2 of substrate 4 there is a sensor diaphragm 25 having functional patterns 7, in this case using piezoresistive converter elements. Behind sensor diaphragm 25, a recess 6 is etched anisotropically into substrate 4. Because of anodic bonding of substrate 4 onto a pyrex glass 35, recess 6 forms a cavity 6 between substrate 4 and pyrex glass 35. The composite of substrate 4 and pyrex glass 35 is connected to a printed-circuit board 22 or a housing 27, a premold housing, for instance, by an adhesive layer 26 or a solder layer 26. Front side 2 of substrate 4 is connected electrically conductively to printed-circuit board 22, using a bonding wire 21. A gel ring 28 on printed-circuit board 22 or housing 27 encloses the device, and is filled with a passivating gel 23. The sensor shown is an absolute pressure sensor. The stretching of sensor diaphragm 25, because of the pressure of medium 24, is measured by the piezoresistive converter elements, whose signals are able to be evaluated using an integrated circuit.

Figure 2:
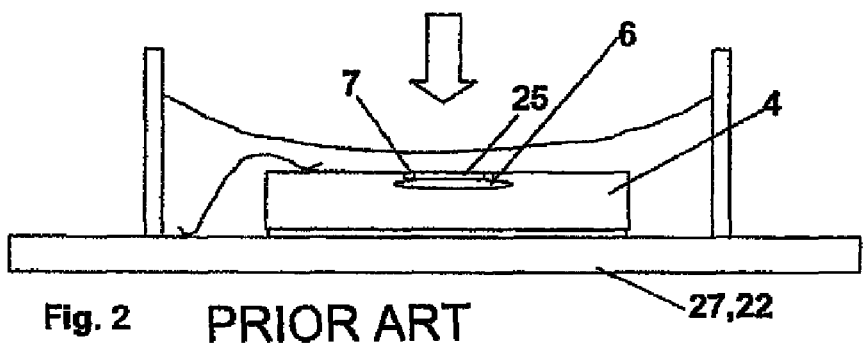

An absolute pressure sensor according to the related art is also shown in FIG. 2. Sensor diaphragm 25, having cavity 6 lying behind it, is produced from porous silicon using a surface micromechanical method, as described in DE 100 32 579 A1. In that way, substrate 4 is advantageously able to be adhered directly onto a printed-circuit board 22 or a housing 27. Thus, one may do without anodic bonding on glass.

Figure 3:
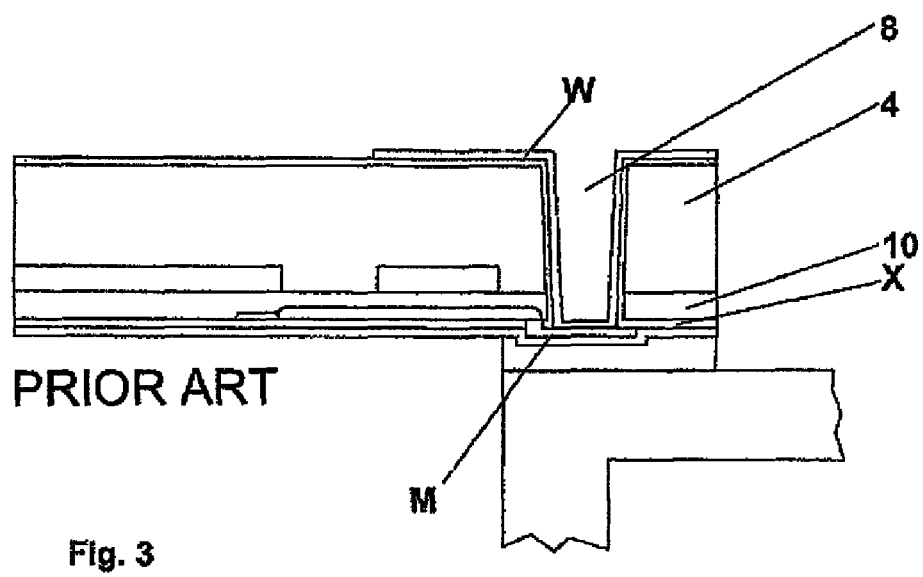

FIG. 3 shows a micromechanical component having wafer plated-through hole W of substrate 4 through a contact hole 8, according to the related art. An etching stop in the trench process takes place first on an oxide X, which in this case is situated between an epitaxial layer 10 and a metal printed-circuit board M. In this very thin area, the micromechanical component has a diminished mechanical stability.

Figure 4:
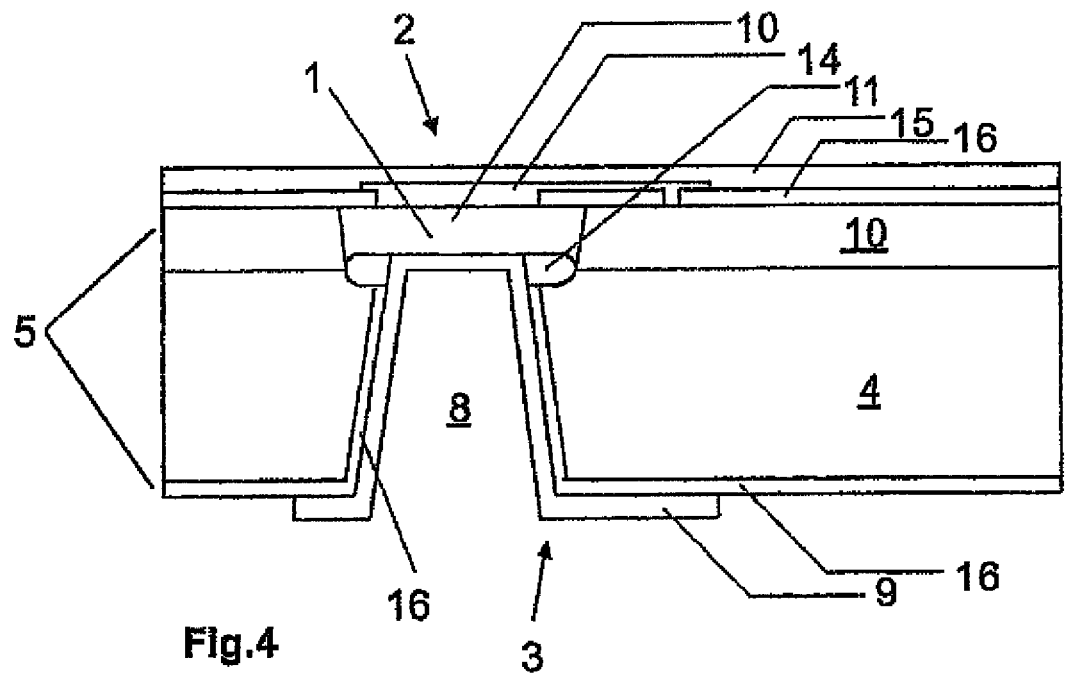
FIGS. 4 to 10 show sectional representations of various specific example embodiments, according to the present invention, of a micromechanical component.

FIG. 4 shows a schematic cross section of a first specific embodiment of a micromechanical component according to the present invention, having a substrate 4 that has a front side 2 and a backside 3. In order to produce a contact hole 8 starting from backside 3, a trench etching process is used which stops on a thermal oxide 11. Thus, there remains a diaphragm 1 between contact hole 8 and front side 2, diaphragm 1 contributing to the stability of the micromechanical component. Oxide 11 is deposited before the application of an epitaxial layer 10 in a contact region 5. Contact region 5 designates the region of the micromechanical component between front side 2 and backside 3, in which contact hole 8 is situated. Thus, contact region 5 differs from other, for instance, functional regions of the micromechanical component, into which we shall go in FIGS. 11 to 17, for example. The process for producing contact hole 8 includes, for example:

- thermal oxidation and patterning of the surface of substrate 4,
- silicon epitaxy, polycrystalline silicon (epi-poly) 10' being created above oxide 11,
- masking of backside 3 for the trench etching process,
- trench etching of contact hole 8 from the backside with stop in thermal oxide 11,
- insulating method on the front side, in order to insulate the polycrystalline silicon regions from one another, for instance, by doping rings or trenched and filled up insulating trenches (not shown),
- depositing an insulating layer 16 onto the backside, made of oxide or nitride, for instance,
- lithography of backside 3 for opening insulating layer 16 and thermal oxide 11 on the trench floor of contact hole 8.
- depositing and patterning of a connection using electrically conductive material 9 on backside 3, for example, plated-through hole having doped, polycrystalline silicon or metal, or a combination of the two.

On front side 2, the micromechanical component also has an insulating layer 16 and a passivating layer 15, made up of silicon nitride, foe example. For the plated-through hole, in this case, a metallization 14 is used. The conductive connection between backside contact 9 and metallization 14 is achieved by doping epi-poly 10'. Further dopings on the wafer's front side 2 for producing connections, or for producing the actual chip function, are not shown here. Even insulations usual according to the related art, in this instance, the ones of the bond pads, are predominantly not illustrated, for the sake of clarity.

Figure 5:
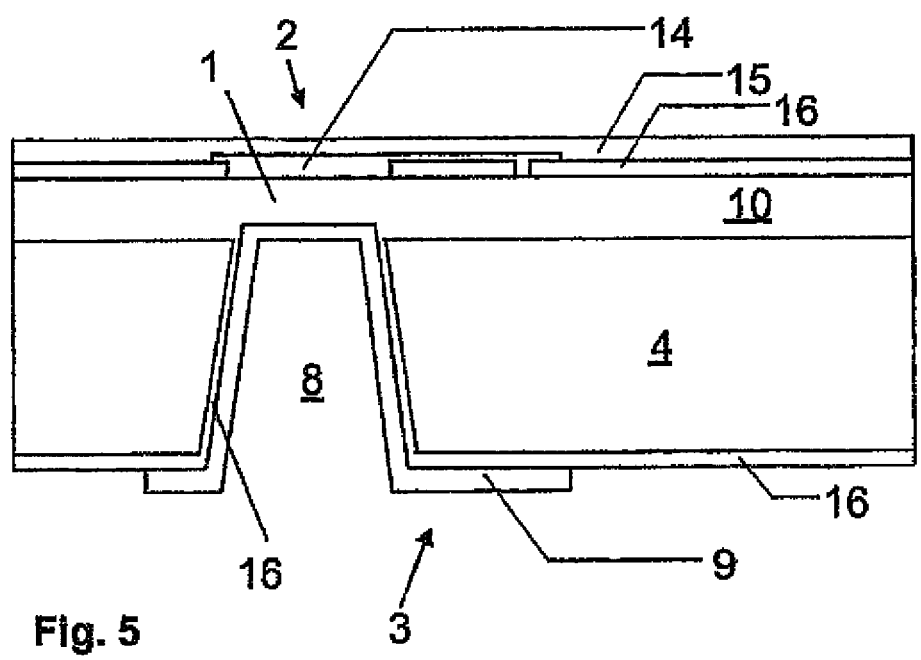

FIG. 5 shows a second specific embodiment of the micromechanical component according to the present invention. The trench process for producing contact hole 8 stops in epitaxial layer 10, in this case. In processes in which no epitaxy is provided, it is also possible to stop in the bulk silicon of substrate 4. As compared to the specific embodiment according to FIG. 4, the production process shown here is more universally applicable. The thermal oxidation is omitted. The targeted stopping of the trench etching process, on the other hand, is more demanding, particularly since epitaxial layer 10, at a thickness of 10 micrometer, for example, is thinner by a multiple than substrate 4, as a rule.

Figure 6:
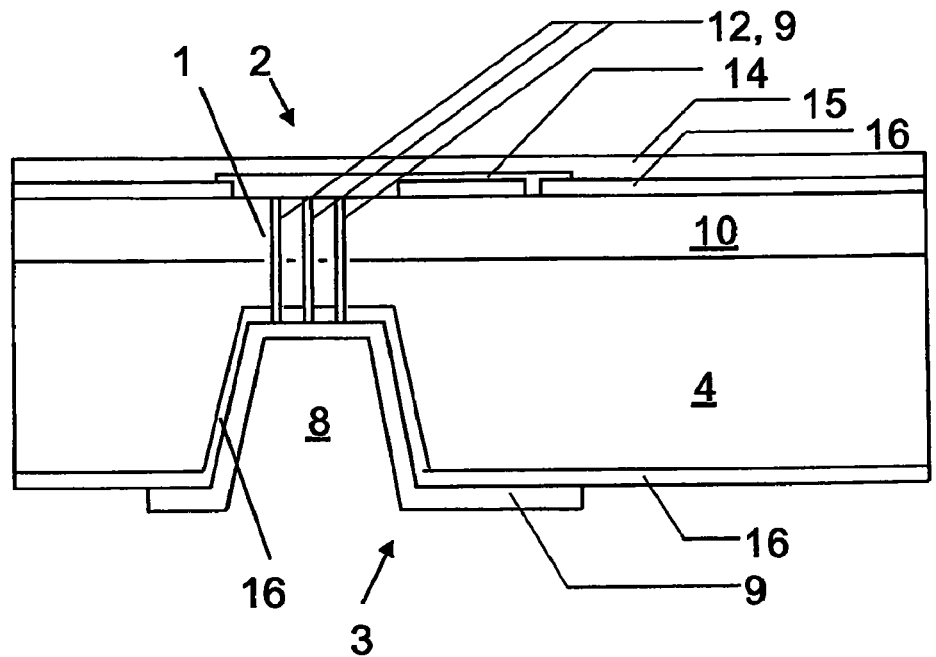

FIG. 6 shows a second specific embodiment of the micromechanical component according to the present invention. In this instance, in two successive trench etching steps, contact hole 8 and one or more plated-through holes 12 are produced. As compared to the specific embodiments according to FIGS. 4 and 5, diaphragm 1 has a greater thickness in this case, which advantageously increases its stability. However, continuous plated-through holes 12, that are clearly tighter in cross section, do not substantially limit the stability. A further advantage of the specific embodiment is that there is a greater aiming-off allowance in the trenching of contact hole 8 starting from backside 3. Because of that, process tolerances are able to be compensated for. The trench etching process of plated-through holes 12 also takes place starting from backside 3, and is stopped on metallization 14, in this instance. The process is able to be shaped using the following steps, for example:

- masking of backside 3 for the trench etching process of contact hole 8,
- trench etching of contact hole 8 starting from backside 3, stopping with great aiming-off allowance in substrate 4,
- spray lacquering of backside 3 with exposure on the trench floor of contact hole 8, as a mask for the trench etching process of plated-through holes 12,
- trench etching of plated-through holes 12 starting from backside 3, in this instance, stopping at front side metallization 14,
- depositing an insulating layer 16,
- spray lacquering of backside 3, the trench floors of plated-through holes 12 being not lacquered or only incompletely lacquered because of the high aspect ratio,
- anisotropic dry etching step for opening insulating layer 16 of metallization 14, as well as possibly additional insulating layers that are not shown,
- depositing and patterning conductive material 9 on backside 3, in contact hole 8 and in plated-through holes 12.

The method may also be used in processes not involving epitaxy.

Figure 7:
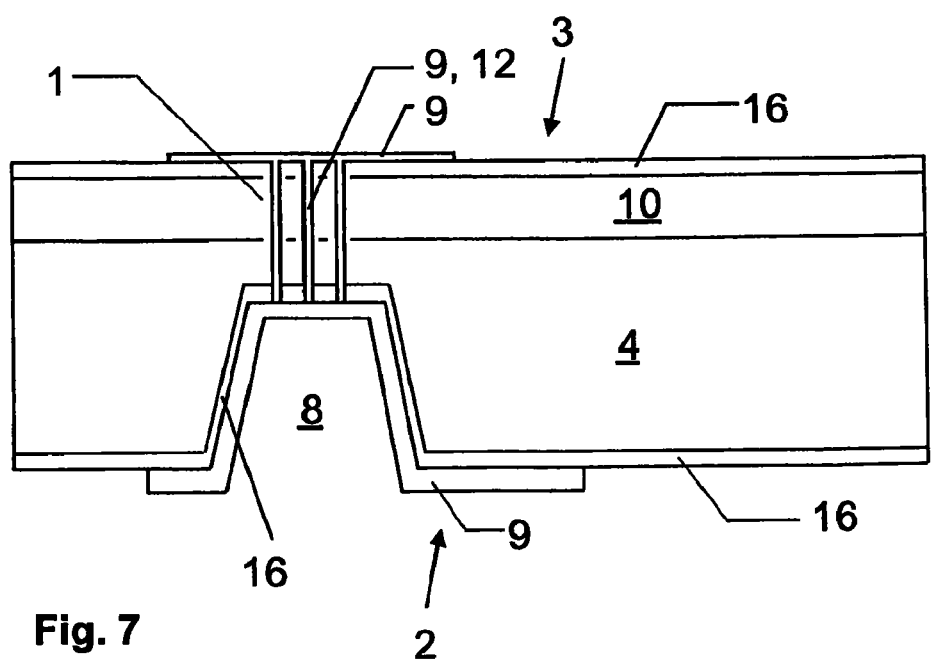
Figure 8:
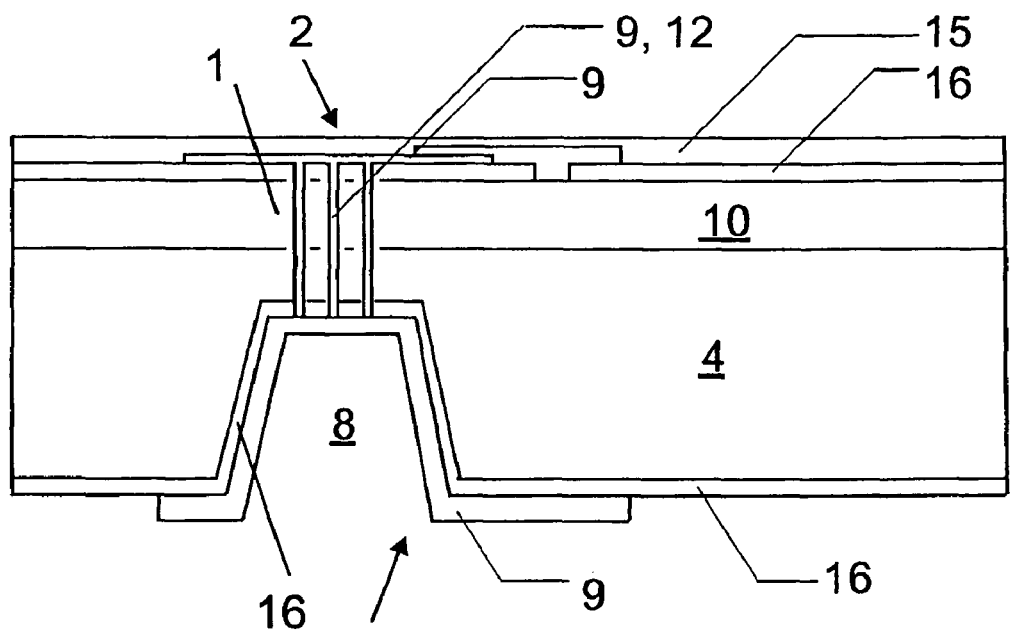

In FIGS. 7 and 8, an additional possibility for producing a specific embodiment of the micromechanical component according to the present invention is shown, which is comparable to the specific embodiment according to FIG. 6. FIG. 7 shows an intermediate stage, contact hole 8 and plated-through holes 12 being first etched continuously through substrate 4 and optional epitaxial layer 10. For plated-through holes 12, in this case there also exists the possibility of trenching them starting from front side 2, which simplifies the masking, for example. To the extent that this takes place before the trenching of contact hole 8, we refer here to blind holes 12' (see FIG. 9), which become plated-through holes 12 by being opened up. One advantage of this variant of the method is that using one depositing of electrically conductive material 9, plated-through holes 12 were able be filled up and the contact layers could be produced on front side 2, in contact hole 8 and/or on backside 3. Metallization 14 and passivating layer 15 are applied subsequently, as shown in FIG. 8. One possible process, for example, has the following step sequence:

- masking front side 2 for the trench etching process of blind holes 12' (see FIG. 9),
- trench etching of blind holes 12',
- masking of backside 3 for the trench etching process of contact hole 8,
- trench etching of contact hole 8 until plated-through holes 12 are opened,
- depositing an insulating layer 16,
- depositing of polycrystalline silicon, for example, preferably in an LPCVD method (low-pressure chemical vapor deposition), simultaneously on front side 2 and backside 2, possibly having doping in situ, or obtaining subsequent doping.

Figure 9:
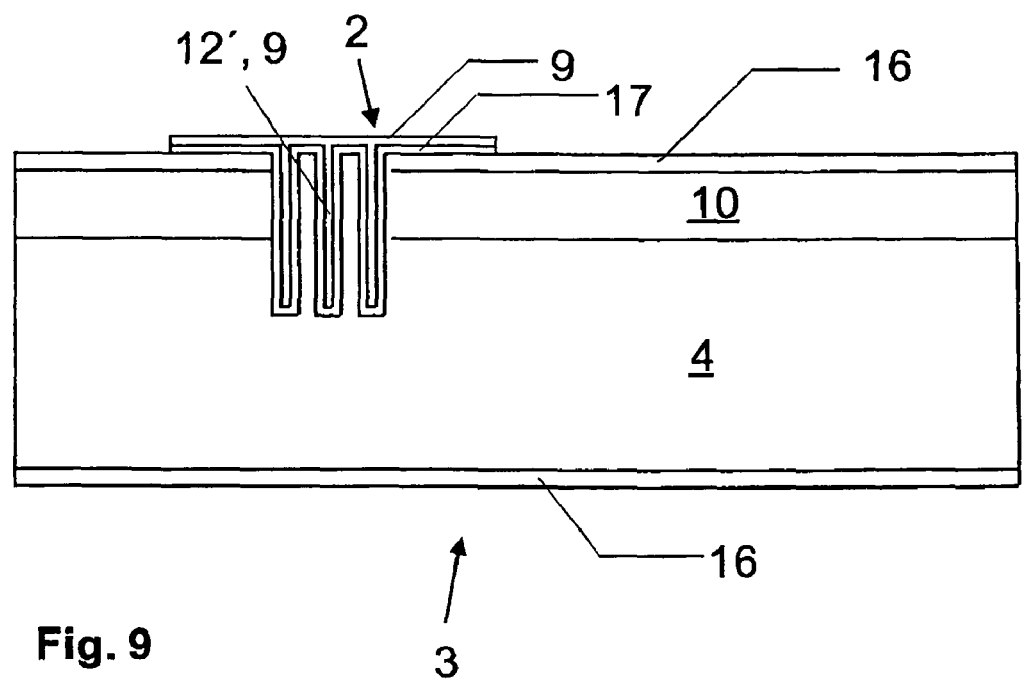
Figure 10:
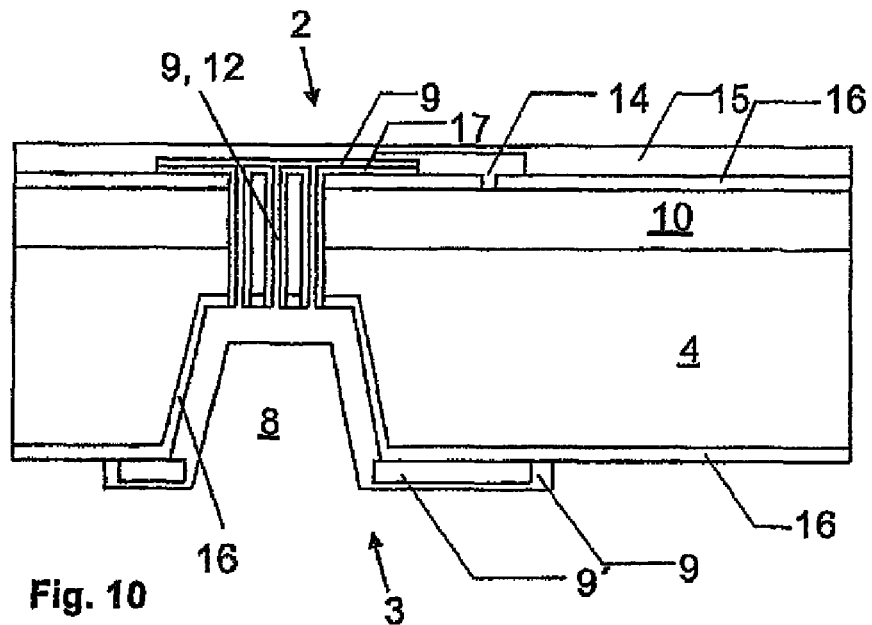

FIGS. 9 and 10 show a further possibility for producing the specific embodiment of the micromechanical component according to the present invention, according to FIG. 8. FIG. 9 shows an intermediate stage, first blind holes 12' being etched, starting from front side 2, and an insulating layer 16 being deposited. Subsequently, insulated blind holes 12' are filled up using electrically conductive material 9, preferably polycrystalline silicon. For the purpose of depositing the insulating layer, suitable methods are used, such as plasma-enhanced chemical vapor deposition (PECVD), sub-atmospheric chemical vapor deposition (SACVD) at approximately 0.3 bar, or thermal oxidation. Thereafter, from backside 3, plated-through holes 12 are created, by etching contact hole 8, as shown in FIG. 10, by opening filled-up blind holes 12' of FIG. 9. One advantage of this production method is that an etching stop always takes place in substrate 4, in this instance, so that the micromechanical component at no time has continuous openings, which permits easier handling in its production. One possible process, for example, has the following step sequence:

- masking front side 2 for the trench etching process of blind holes 12',
- trench etching of blind holes 12',
- oxidation (insulating layer 16),
- depositing a nitride layer 17, which is later able to act as masking during thermal oxidation, preferably in the LPCVD method,
- deposition, for instance, polycrystalline silicon 9 on front side 2 and in blind holes 12,
- masking of backside 3 for contact hole 8,
- oxidation of contact hole 8, starting from backside 3, until polycrystalline silicon 9 having nitride layer 17 has been partially exposed,
- thermal oxidation of an insulation layer 16 in contact hole 8, only a small quantity of oxide (thin ReOxide) forming on polycrystalline silicon 9 because of nitride layer 17,
- nitride etching starting from backside 3, for instance, in a dry etching step having a higher nitride etching rate than oxide etching rate, for removing the exposed part of nitride layer 17 from polycrystalline silicon 9,
- contacting the exposed part of the polycrystalline silicon 9, in this instance, for example, by a backside contact to a combination of polycrystalline silicon 9 and metal 9'.

In the methods described before, before the trenching of contact hole 8, substrate 4 may advantageously be ground back starting from backside 3. This permits an abbreviation of the trenching step. A substrate 4 that is thin anyway is preferably used.

Figure 11:
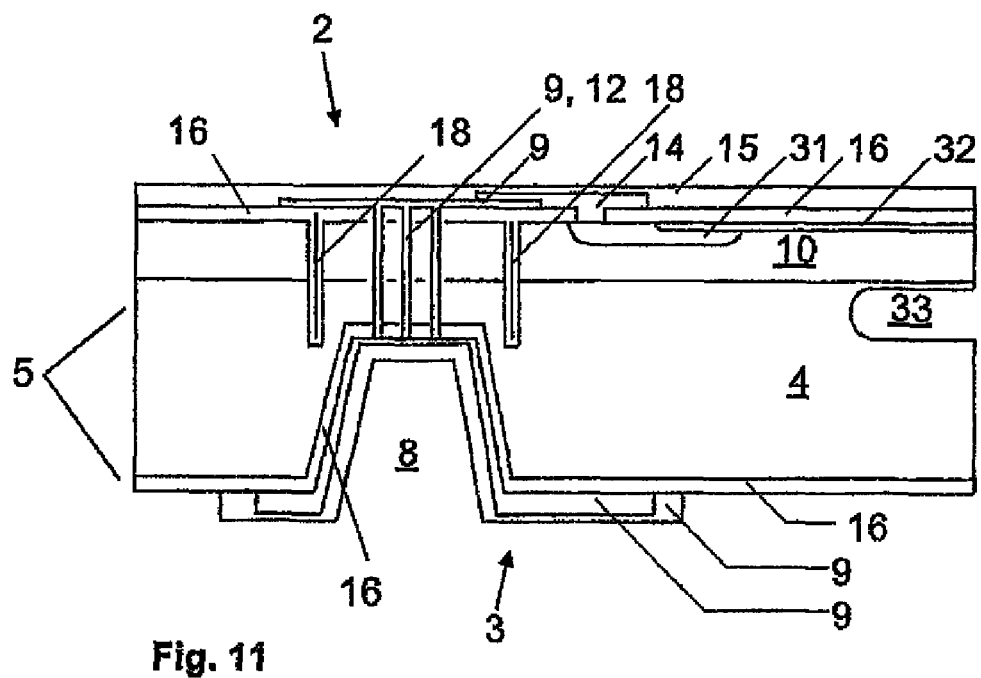
FIGS. 11 to 17 show sectional representations of exemplary applications of the specific example embodiments according to FIGS. 4 to 10.
Figure 12:
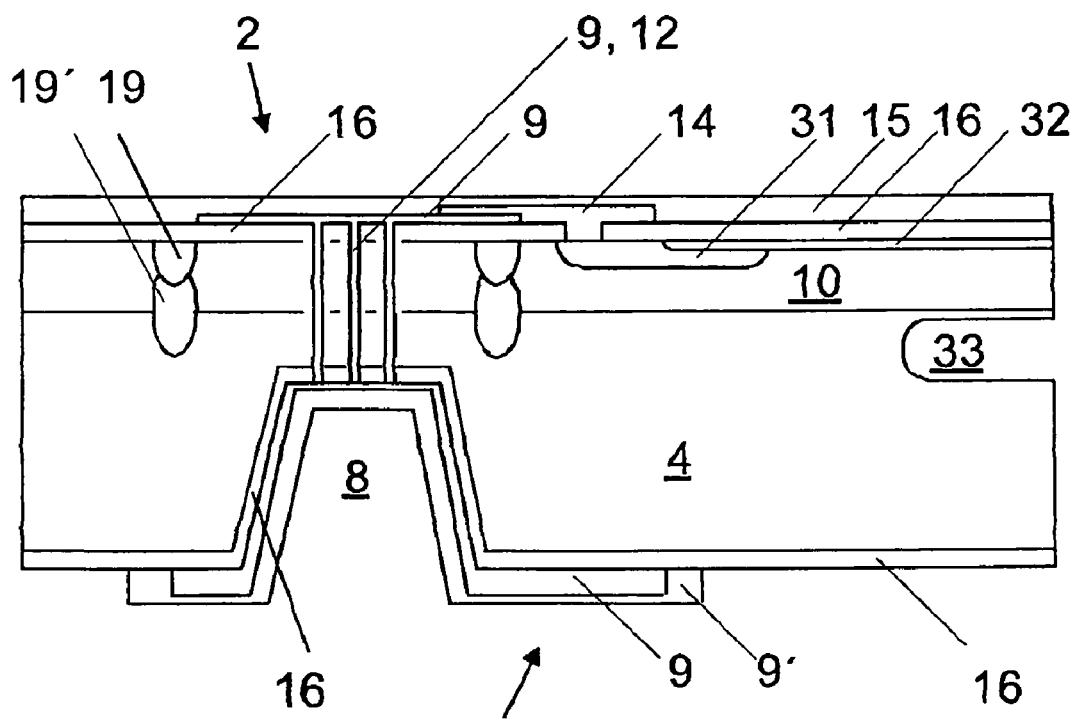
Figure 13:
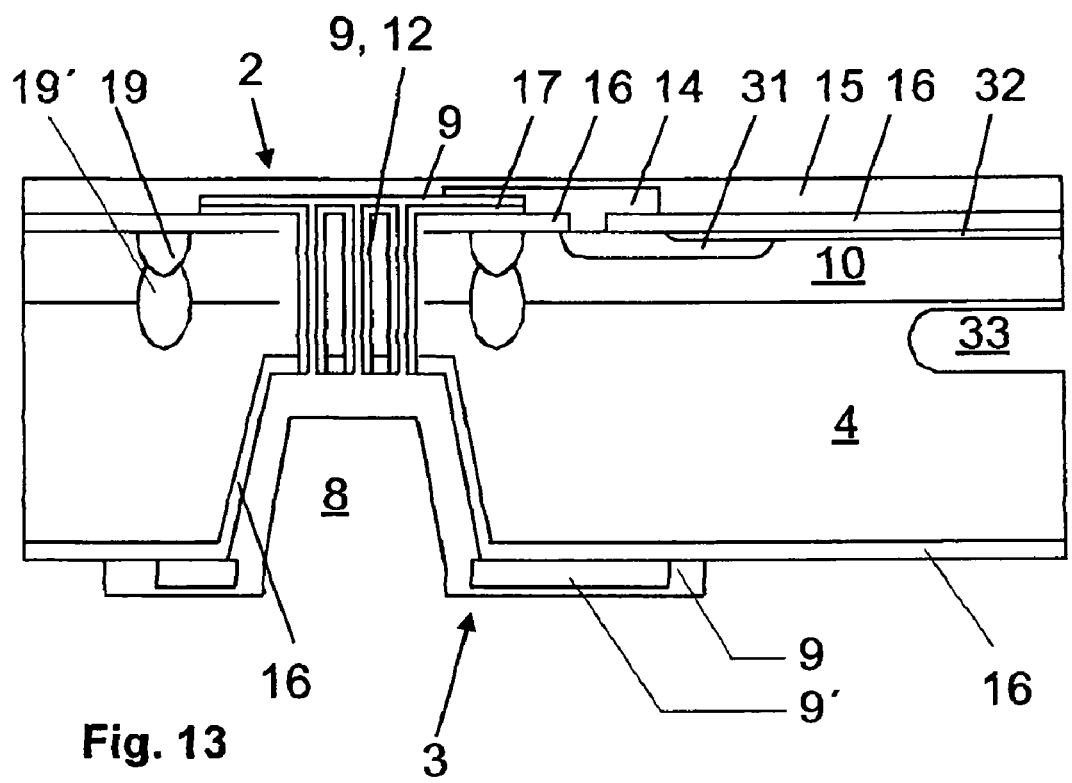
Figure 14:
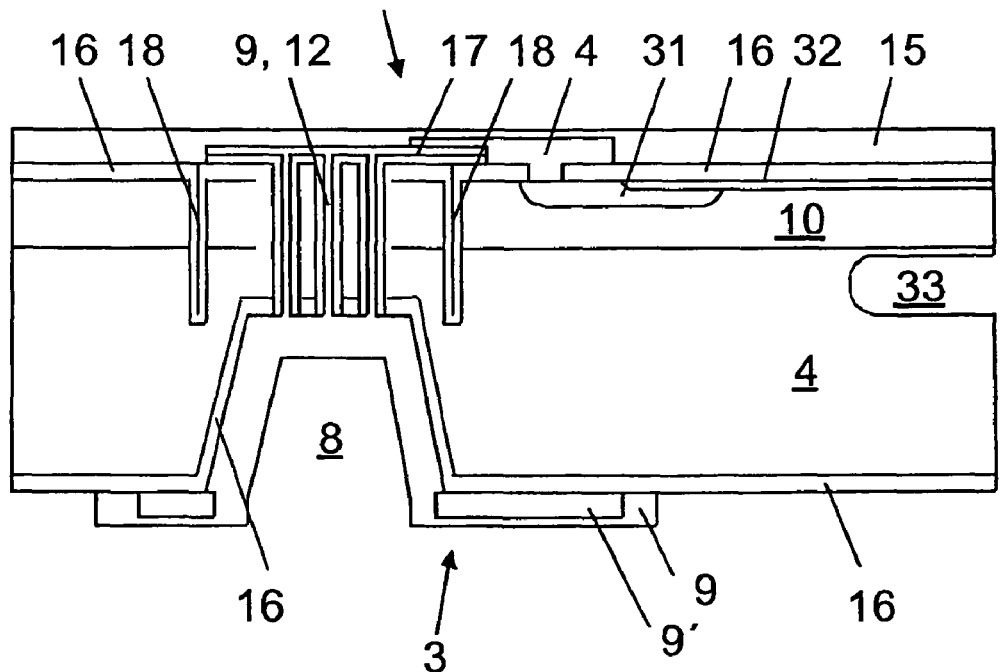

FIGS. 11 and 12 show possible applications for the specific embodiment according to FIG. 8. FIGS. 13 and 14 show the same applications for the specific embodiment according to FIG. 10. Contact region 5 is insulated from the remaining region of substrate 4. As an example of a functional pattern 7, a piezoresistive surface micromechanical (OMM) pressure sensor 7 is shown.

FIG. 11 shows oxidized trench insulation trenches 18 in contact region 5, which extend from insulating layer 16 of front side 2 through epitaxial layer 10 into substrate 4. Piezoresistive OMM pressure sensor 7 has a p-doped supply line 31 and a p-doped piezo resistor 32 in n-doped epitaxial layer 10, as well as a cavity 33 in p-doped substrate 4. Functional pattern 7, as the pressure sensor, is connected via doped supply line 31, metallization 14 and polycrystalline silicon 9, in a manner that is electrically conductive, to backside 3 of the micromechanical component.

FIG. 12 shows p-doped, upper insulating rings 19, which extend from insulating layer 16 of front side 2 into n-doped epitaxial layer 10, and also p-doped, lower insulating rings 19', which extend from epitaxial layer 10 into p-doped substrate 4. The piezoresistive OMM pressure sensor corresponds to FIG. 11.

FIG. 13 shows the application corresponding to FIG. 12, in this case, by a specific embodiment of the micromechanical component according to FIG. 10. FIG. 14 shows the application corresponding to FIG. 11, also in a specific embodiment of the micromechanical component according to FIG. 10.

Figure 15:
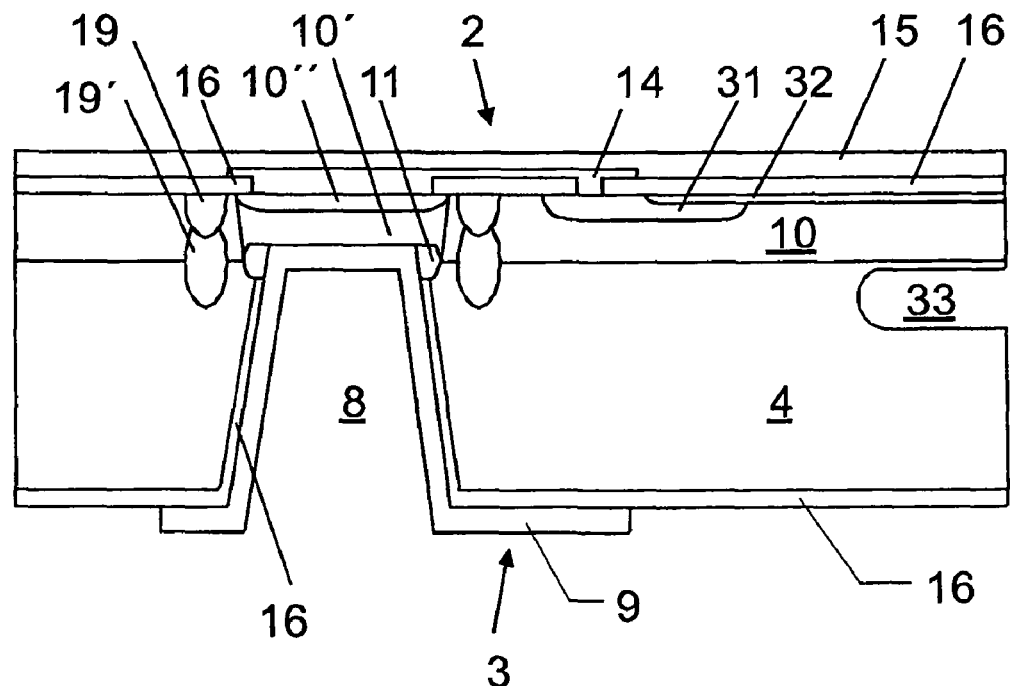
Figure 16:
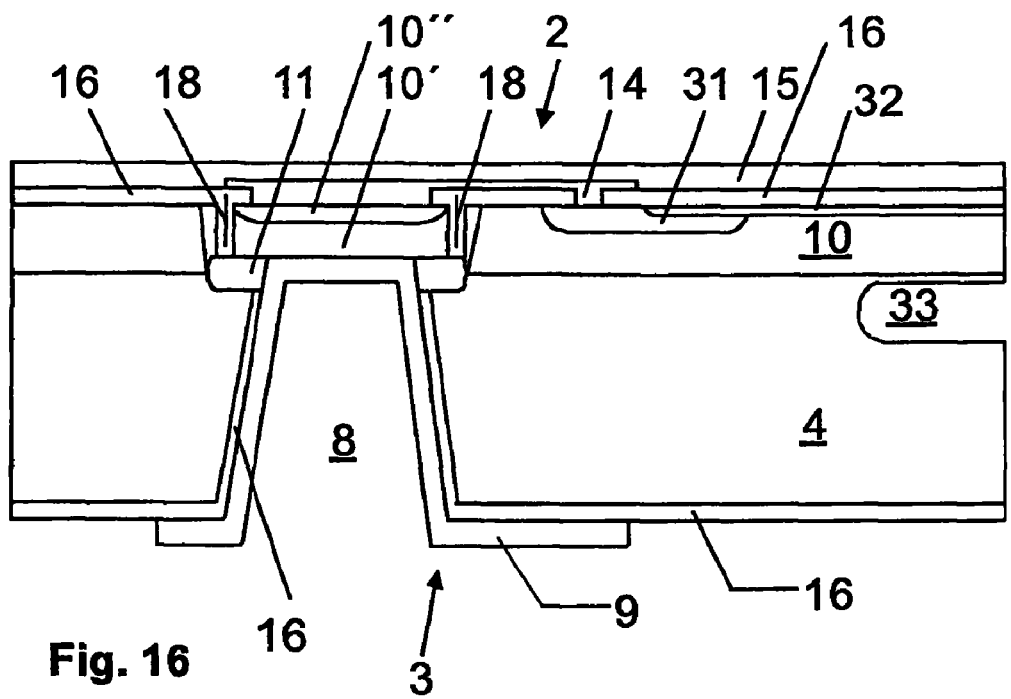
Figure 17:
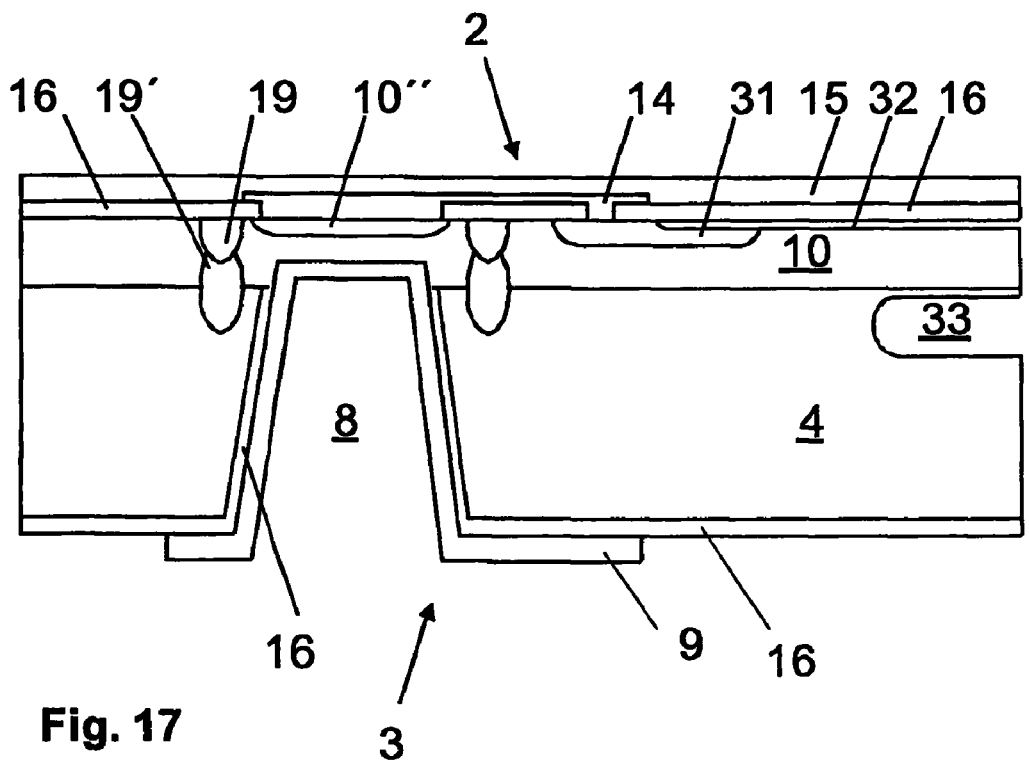

In FIGS. 15 to 17, as a possible functional pattern 7, there is also shown piezoresistive OMM pressure sensor 7, as in FIGS. 11 through 14, but in this case, for the specific embodiments of the micromechanical component according to FIGS. 4 and 5.

FIG. 15 relates to the first specific embodiment of the micromechanical component of FIG. 4, and shows p-doped, upper insulating rings 19, which extend from insulating layer 16 of front side 2 into n-doped epitaxial layer 10, and also p-doped, lower insulating rings 19', which extend from epitaxial layer 10 into p-doped substrate 4. n-doped polycrystalline part 10' (epi-poly) of epitaxial layer 10, above oxide layer 11, has a region, in this case, having increased n-doping 10" for contacting metallization 14.

FIG. 16 also refers to the first specific embodiment of the micromechanical component of FIG. 4, and shows oxidized insulating trenches 18, which extend from insulating layer 16 through epitaxial layer 10 up to oxide layer 11. n-doped epi-poly 10', in this case also has the region having increased n-doping 10".

FIG. 17 refers to the second specific embodiment of the micromechanical component of FIG. 5, and shows p-doped, upper insulating rings 19, which extend from insulating layer 16 of front side 2 into n-doped epitaxial layer 10, and also p-doped, lower insulating rings 19', which extend from epitaxial layer 10 into p-doped substrate 4. Below metallization 14, a region is situated having increased n-doping 10" for contacting.

What is claimed is:

1. A micromechanical component, comprising:
   a substrate having a front side and a back side, wherein the back side of the substrate defines a back side of the micromechanical component; and
   a functional pattern located on a front side of the micromechanical component, the functional pattern being electrically contacted to the back side of the substrate in a contact region;
   wherein:
   the substrate has at least one contact hole and a plurality of plated-through holes in the contact region, the contact hole extending from the back side of the substrate towards a front side of the micromechanical component, the plurality of plated-through holes coated with an electrically conductive material to connect the contact hole to the front side of the micromechanical component through each of the plated-through holes at a common electric potential;
   a mechanically stable diaphragm is situated between the contact hole and the front side of the micromechanical component;
   an epitaxial layer is provided on the front side of the substrate, and the contact hole extends at least up to the epitaxial layer; and
   between the substrate and the epitaxial layer, an oxide layer is situated at least in the contact region.

2. A method for producing a micromechanical component having a functional pattern located on a front side of the micromechanical component, a mechanically stable diaphragm, a plurality of plated-through holes, and a contact hole, the method comprising:
   producing the contact hole starting from a back side of a substrate corresponding to a back side of the micromechanical component towards a front side of the micromechanical component by a first trench etching process, the etching process being stopped, in a controlled manner, at an epitaxial layer, whereby the mechanically stable diaphragm remains between the end of the contact hole and the front side of the micromechanical component;
   producing a plurality of plated-through holes by a second etching process and coating the plurality of plated-through holes with an electrically conductive material to connect the contact hole to the front side of the micromechanical component through each of the plated-through holes at a common electric potential; and providing an electrical contact between the functional pattern and the backside of the micromechanical component at a contact region, wherein the electrical contact extends all the way through the diaphragm.

3. The method as recited in claim 2, wherein:
an oxide layer is applied onto the substrate at least in the contact region, before the application of the epitaxial layer, and the first trench etching process is stopped at the oxide layer.

4. The method as recited in claim 2, wherein the plurality of plated-through holes are etched starting from the contact hole, and wherein the etching of the plated-though holes is stopped at a surface metallization provided on the front side of the micromechanical component.

5. The method as recited in claim 3, wherein after the plated-through holes have been etched, an insulating layer is deposited, and thereafter an electrically conductive material is applied at least in the plated-through holes, and in the contact hole.

6. The method as recited in claim 3, wherein before the etching of the contact hole, at least one blind hole is produced from the front side of the micromechanical component, the blind hole being subsequently insulated and filled with an electrically conductive material, and wherein the etching of the contact hole from the back side of the micromechanical component opens the blind hole, and wherein at least one of the plated-through holes is formed by the opening of the blind hole.

7. The method as recited in claim 6, wherein at least one oxidized insulation trench is produced simultaneously with the blind hole in one process step by trench etching.

* * * * *